(12) United States Patent
Kuwabara et al.

(10) Patent No.: US 9,425,028 B2
(45) Date of Patent: Aug. 23, 2016

(54) PLASMA PROCESSING APPARATUS

(71) Applicant: Tokyo Electron Limited, Tokyo (JP)

(72) Inventors: Yusei Kuwabara, Miyagi (JP); Nobuaki Shindo, Miyagi (JP); Sachie Ishibashi, Miyagi (JP); Takahiko Kato, Miyagi (JP); Noboru Maeda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 442 days.

(21) Appl. No.: 14/058,538

(22) Filed: Oct. 21, 2013

(65) Prior Publication Data

US 2014/0116620 A1     May 1, 2014

Related U.S. Application Data

(60) Provisional application No. 61/721,073, filed on Nov. 1, 2012.

(30) Foreign Application Priority Data

Oct. 25, 2012 (JP) ................. 2012-235884

(51) Int. Cl.
| | | |
|---|---|---|
| *C23C 16/50* | (2006.01) | |
| *H01J 37/32* | (2006.01) | |
| *C23C 16/505* | (2006.01) | |
| *C23C 16/509* | (2006.01) | |

(52) U.S. Cl.
CPC ........... *H01J 37/32568* (2013.01); *C23C 16/50* (2013.01); *C23C 16/505* (2013.01); *C23C 16/509* (2013.01); *H01J 37/32036* (2013.01); *H01J 37/32091* (2013.01); *H01J 37/32449* (2013.01)

(58) Field of Classification Search
CPC ................. H01J 37/32568; H01J 37/32449; H01J 37/32091; H01J 37/32036; C26C 16/505; C26C 16/509
USPC ......... 118/723 E, 723 R; 156/345.43, 345.44, 156/345.34, 345.35
See application file for complete search history.

(56) References Cited

U.S. PATENT DOCUMENTS 8,430,962 B2 * 4/2013 Masuda ............ C23C 16/45561
                                                                   118/663

(Continued)

FOREIGN PATENT DOCUMENTS

| JP | 2001-274147 | 10/2001 |
|---|---|---|
| JP | 2006-165399 | 6/2006 |
| JP | 2008-177428 | 7/2008 |

*Primary Examiner* — Rudy Zervigon

(74) *Attorney, Agent, or Firm* — IPUSA, PLLC

(57) ABSTRACT

A plasma processing apparatus includes an upper electrode arranged at a processing chamber and including a plurality of gas supplying zones, a branch pipe including a plurality of branch parts, an addition pipe connected to at least one of the branch parts, and a plurality of gas pipes that connect the branch parts to the gas supplying zones. The upper electrode supplies a processing gas including a main gas to the processing chamber via the gas supplying zones. The branch pipe divides the processing gas according to a predetermined flow rate ratio and supplies the divided processing gas to the gas supplying zones. The addition pipe adds an adjustment gas. A gas flow path of the gas pipe connected to the branch part to which the addition pipe is connected includes a bending portion for preventing a gas concentration variation according to an adjustment gas-to-main gas molecular weight ratio.

6 Claims, 12 Drawing Sheets

(56) References Cited

U.S. PATENT DOCUMENTS

| | | | |
|---|---|---|---|
| 9,055,661 B2 * | 6/2015 | Tanaka | H05H 1/46 |
| 2009/0117746 A1 * | 5/2009 | Masuda | C23C 16/45561 |
| | | | 438/710 |
| 2013/0206338 A1 * | 8/2013 | Tanaka | H05H 1/46 |
| | | | 156/345.33 |
| 2014/0116620 A1 * | 5/2014 | Kuwabara | H01J 37/32568 |
| | | | 156/345.24 |

* cited by examiner

FIG.6A

| CONDITION | A | B | C |
|---|---|---|---|
| C4F8 GAS FLOW RATE [sccm] | 0 (NOT ADDED) | 10 | 22 |
| GAS CONCENTRATION UNIFORMITY (EDGE SIDE) [%] | 0.9 | 5.8 | 7.4 |

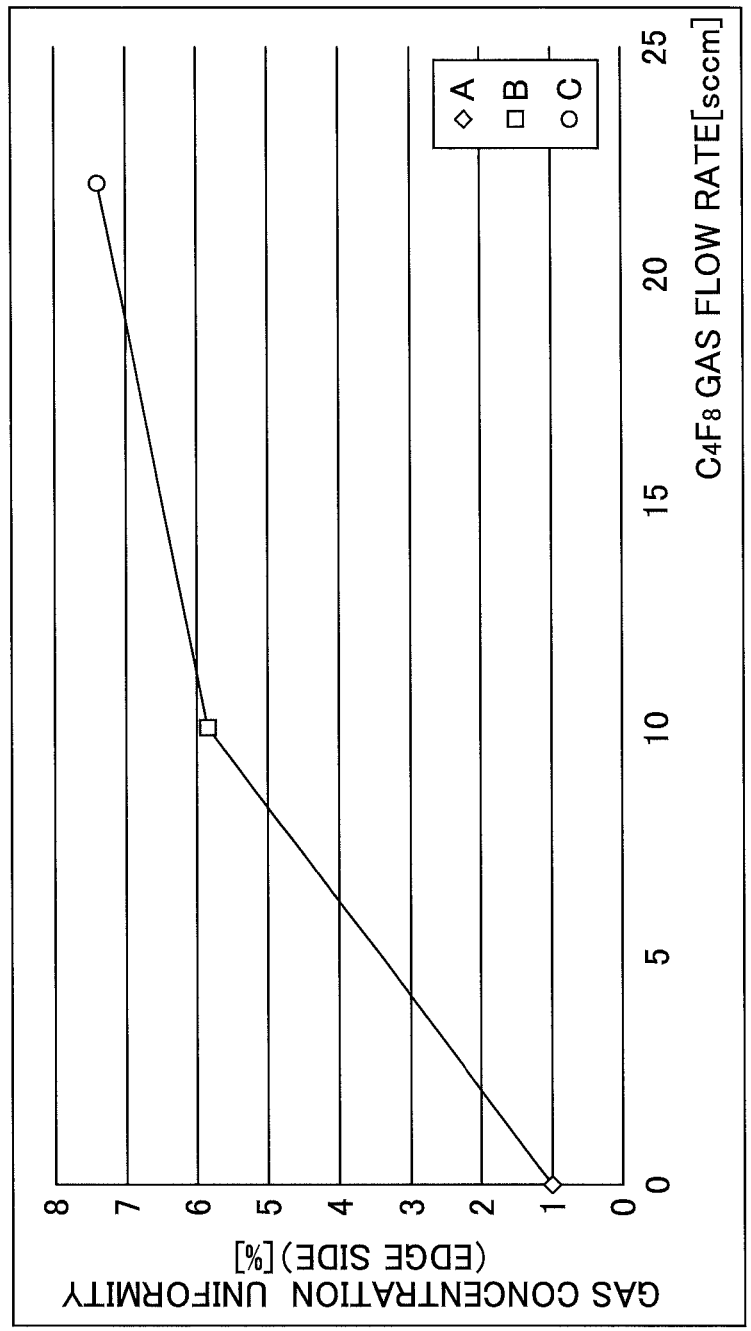

FIG.7A

| CONDITION | D | E | F |
|---|---|---|---|
| EDGE SIDE/ CENTER SIDE FLOW RATE RATIO | 80/20 | 50/50 | 20/80 |
| GAS CONCENTRATION UNIFORMITY (EDGE SIDE) [%] | 5.8 | 3.0 | 1.4 |

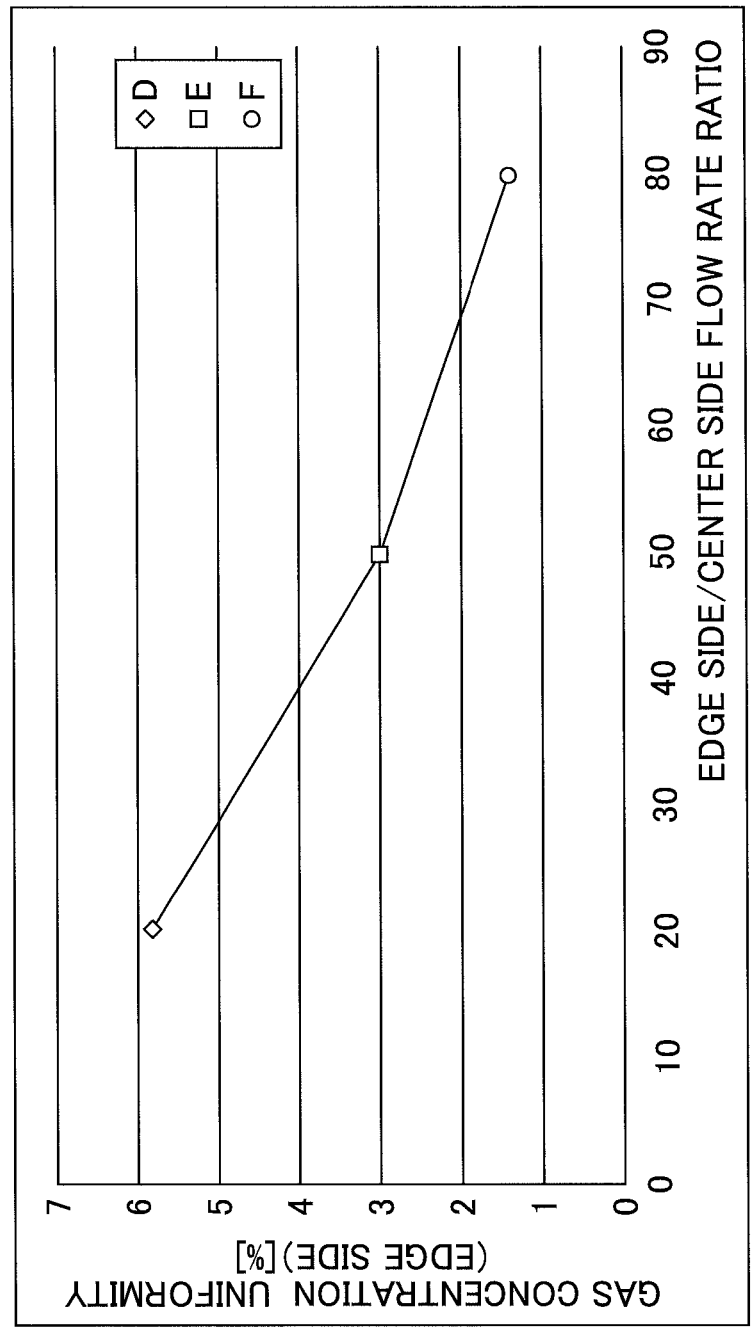

FIG.8A

| CONDITION | G | H | I |
|---|---|---|---|
| PIPE LENGTH [mm] | 52.5 | 150 | 500 |
| GAS CONCENTRATION UNIFORMITY (EDGE SIDE) [%] | 5.8 | 1.2 | 1.0 |

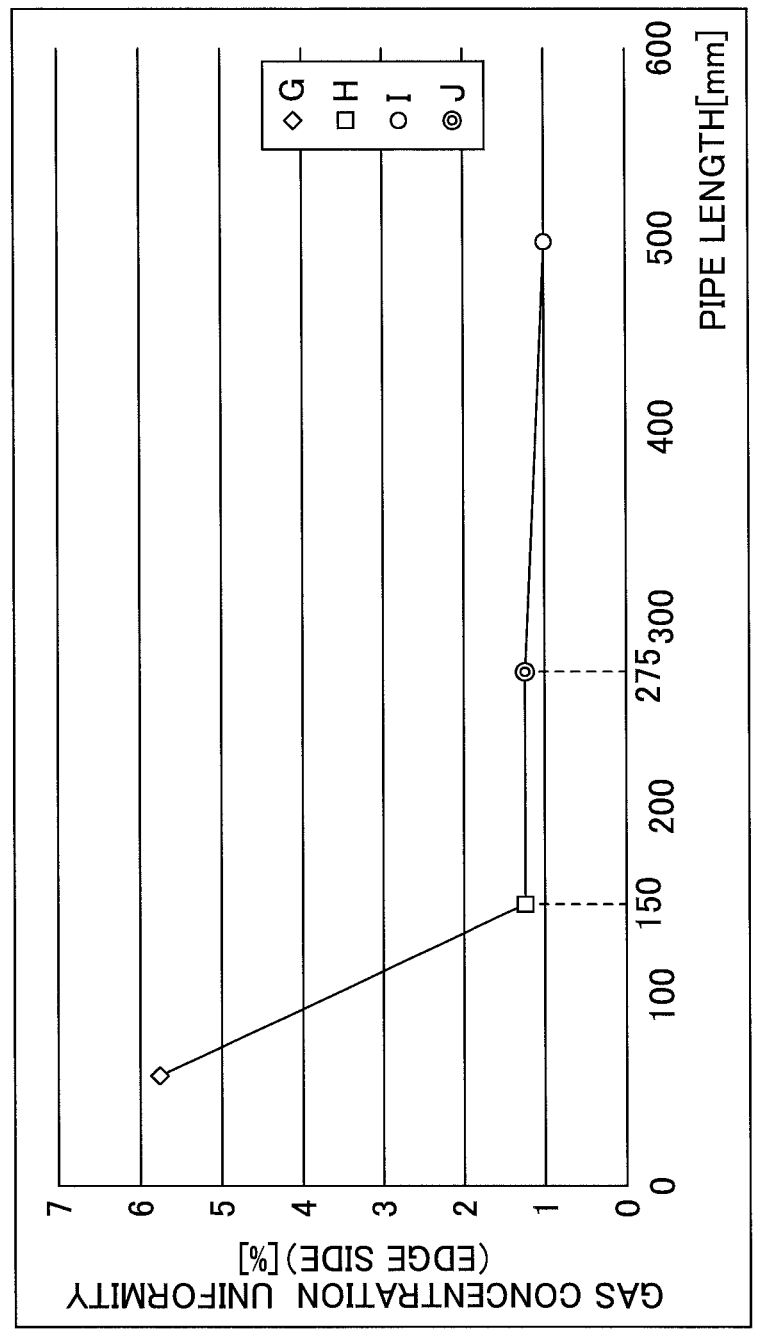

PLASMA PROCESSING APPARATUS

CROSS-REFERENCE TO RELATED APPLICATIONS

The present application is based on and claims priority to Japanese Patent Application No. 2012-235884 filed on Oct. 25, 2012, and U.S. Provisional Patent Application No. 61/721,073 filed on Nov. 1, 2012, the entire contents of which are hereby incorporated by reference.

BACKGROUND OF THE INVENTION

1. Field of the Invention

The present invention relates to a plasma processing apparatus.

2. Description of the Related Art

Plasma processing apparatuses turn gas supplied to a processing chamber into plasma using high frequency power to perform a plasma process on a processing object. One known gas supplying method involves showering the gas into the processing chamber from an upper electrode. Further, in the case of implementing such a gas supplying method, a technique is known that involves arranging multiple gas chambers (gas supplying zones) at an edge side and a center side of the upper electrode and supplying a gas mixture of different types of gases to the processing chamber via the gas chambers (see e.g., Japanese Laid-Open Patent Publication No. 2006-165399).

In Japanese Laid-Open Patent Publication No. 2006-165399, different types of gases are mixed at a mixing pipe and then branched out to multiple branch pipes so that the mixed gas may be supplied to the gas chambers. In this case, by adding an adjustment gas for accelerating the etching rate to one of the branch pipes, for example, a certain gas chamber may supply a processing gas having the adjustment gas added thereto while another gas chamber may supply processing gas without the adjustment gas.

By adjusting the amount of adjustment gas contained in gas that is introduced into the processing chamber from the gas chambers in this manner, variations in the etching rate may be reduced and etching uniformity of a substrate surface may be improved, for example.

However, when an adjustment gas with a relatively large molecular weight is added to a processing gas including a main gas with a relatively small molecular weight, it is difficult to mix the main gas and the adjustment gas together due to their differences in molecular weight. In such case, the gases may be introduced into the processing chamber from a gas shower head before they are adequately mixed together, and so, variations may occur in the mix ratio of the gas introduced into the processing chamber. As a result, in performing a plasma process on a processing object, processing uniformity may be compromised due to variations in the gas concentration of the gas supplied to the processing chamber.

In this respect, the branch pipe into which the adjustment gas is added may be increased in length so that adequate reaction time may be secured for the gases to be completely mixed before they are introduced into the processing chamber. However, a flow rate adjusting apparatus (flow splitter) is arranged to control the flow rate of gas that is branched out to a branch pipe by monitoring the pressure within the branch pipe after the gas is branched out. Accordingly, in order to enable the flow rate adjusting apparatus to promptly monitor pressure variations within the branch pipe after the gas is branched out and reflect the monitoring result in gas flow rate control operations, the length of the branch pipe into which the adjustment gas is added is preferably arranged to be as short as possible. Thus, considering the need to ensure accurate flow rate control by the flow rate adjusting apparatus, the length of the branch pipe cannot be increased to a length that would secure enough reaction time for the gases to be completely mixed. Further, simply increasing the length of the branch pipe linearly may not be compatible with aims to achieve a more compact design and miniaturization of the plasma processing apparatus.

SUMMARY OF THE INVENTION

It is an object of at least one embodiment of the present invention to provide a plasma processing apparatus that has a bending portion arranged within a gas pipe at which a main gas and an adjustment gas are mixed together so that a gas flow path within the gas pipe may be lengthened and gas concentration variations according to the molecular weight ratio of the adjustment gas to the main gas may be prevented.

According to an embodiment of the present invention, a plasma processing apparatus is provided that turns a gas supplied to a processing chamber into plasma using high frequency power and performs a plasma process on a processing object. The plasma processing apparatus includes an upper electrode arranged at the processing chamber and including a plurality of gas supplying zones, a branch pipe including a plurality of branch parts, an addition pipe that is connected to at least one of the plurality of branch parts, and a plurality of gas pipes that connect the plurality of branch parts of the branch pipe to the plurality of gas supplying zones. The upper electrode supplies a processing gas including a main gas to the processing chamber via the gas supplying zones. The branch pipe divides the processing gas according to a predetermined flow rate ratio and supplies the divided processing gas to the plurality of gas supplying zones. The addition pipe adds an adjustment gas to the processing gas. At least one gas pipe of the plurality of gas pipes that is connected to the branch part to which the addition pipe is connected includes a gas flow path that is arranged to have a bending portion for preventing a gas concentration variation according to a molecular weight ratio of the adjustment gas to the main gas.

According to an aspect of the present invention, by providing a bending portion at a gas pipe where a main gas and an adjustment gas are mixed, a gas flow path within the gas pipe may be lengthened so that gas concentration variations according to the molecular weight ratio of the adjustment gas to the main gas may be prevented.

BRIEF DESCRIPTION OF THE DRAWINGS

FIGS. 6A and 6B illustrate a relationship between an adjustment gas flow rate and a gas concentration uniformity;

FIGS. 7A and 7B illustrate a relationship between an edge side/center side flow rate ratio and the gas concentration uniformity;

FIGS. 8A and 8B illustrate a relationship between a pipe length and the gas concentration uniformity;

DESCRIPTION OF THE PREFERRED EMBODIMENTS

In the following, illustrative embodiments of the present invention are described with reference to the accompanying drawings. Note, however, that the present invention is not limited to these embodiments but include numerous variations and modifications that may be made without departing from the scope of the present invention. Also, two of more of embodiments may be combined to the extent such a combination does not create inconsistencies.

[Plasma Processing Apparatus Configuration]

Figure 1:
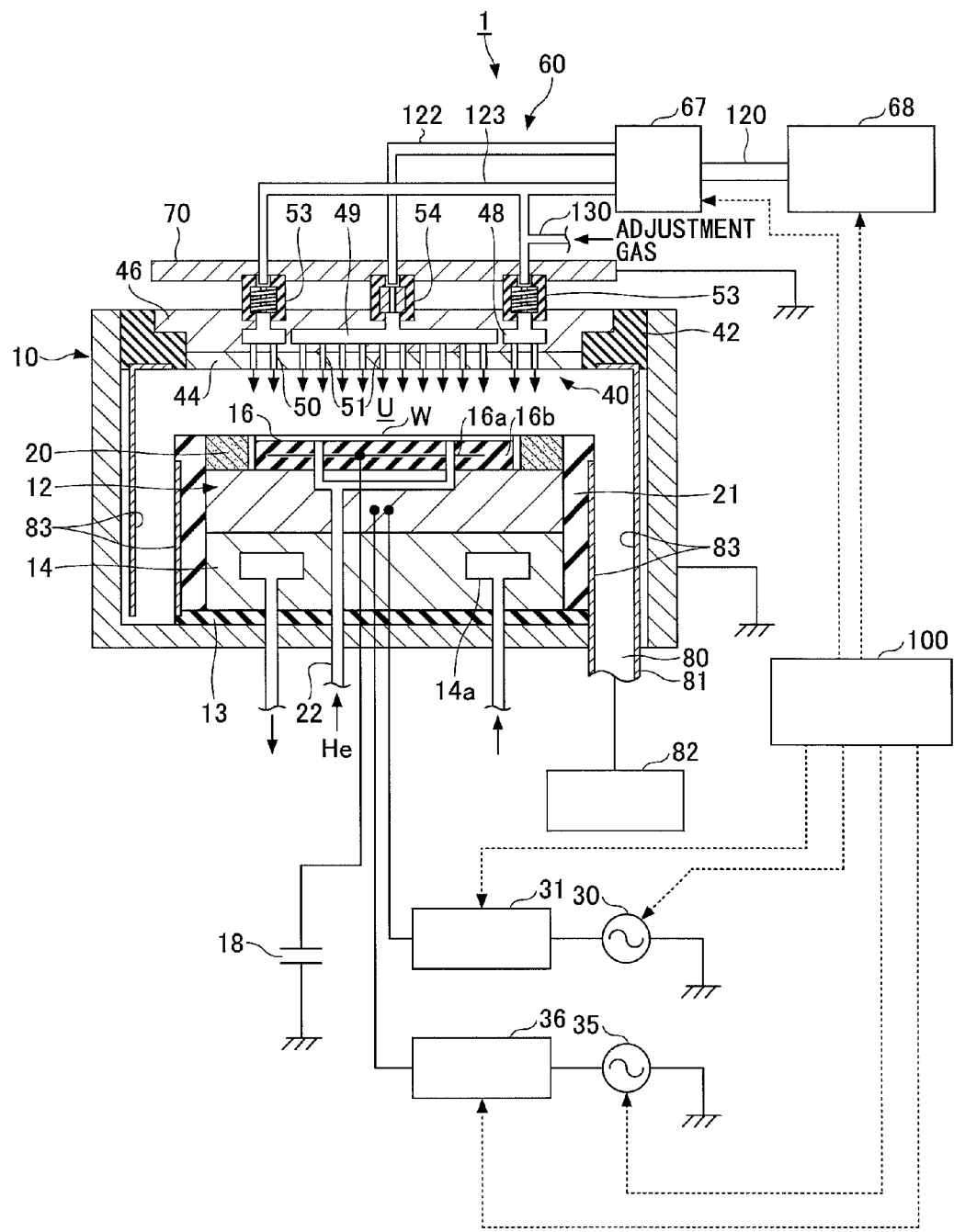
FIG. 1 is a cross-sectional view of a plasma processing apparatus according to an embodiment of the present invention.

First, an exemplary configuration of a plasma processing apparatus according to an embodiment of the present invention is described below with reference to FIG. 1. FIG. 1 is a cross-sectional view of a plasma processing apparatus 1 according to the present embodiment.

The illustrated plasma processing apparatus 1 of the present embodiment corresponds to a parallel plate type plasma etching apparatus. The plasma processing apparatus 1 includes a cylindrical chamber (processing chamber) 10 made of aluminum having an alumite-treated (anodized) surface, for example. The chamber 10 is grounded. A stage 12 that holds a wafer W (an exemplary processing object, also referred to as "substrate W" hereinafter) is arranged inside the chamber 10. The stage 12 may be made of aluminum having an alumite-treated (anodized) surface, for example, and is configured to act as a lower electrode. The stage 12 is supported by a conductor support 14 (simply referred to as "support 14" hereinafter) and is arranged at a bottom of the chamber 10 via an insulating plate 13. An electrostatic chuck 16 that is configured to hold the wafer W by an electrostatic attracting force is provided on a top surface of the stage 12. The electrostatic chuck 16 includes an electrode 16a arranged within an insulator 16b. The electrode 16a is electrically connected to a DC power supply 18. A Coulomb force is generated when a DC voltage is applied from the DC power supply 18 to the electrode 16a so that the wafer W may be electrostatically attracted to the electrostatic chuck 16 by the Coulomb force.

A focus ring 20 that may be made of a single-crystal silicon, for example, is arranged at an upper side outer edge portion of the stage 12. Also, a cylindrical inner wall member 21 that may be made of quartz, for example, is arranged around the stage 12 and the support 14.

A first high frequency power supply 30 is connected to the stage 12 via a first matching unit 31. The first high frequency power supply 30 is configured to output to the stage 12 a high frequency power within a frequency range of 27 MHz to 100 MHz. In the present embodiment, the first high frequency power supply 30 is configured to output a high frequency power of 40 MHz for plasma generation. Also, a second high frequency power supply 35 is connected to the stage 12 via a second matching unit 36. The second high frequency power supply 35 is configured to output to the stage 12 a high frequency power within a frequency range of 400 kHz to 13.56 MHz. In the present embodiment, the second high frequency power supply 35 is configured to output a high frequency power of 3.2 MHz for biasing.

An upper electrode 40 is arranged at a ceiling portion of the chamber 10 at position facing the stage 12. The upper electrode 40 also acts as a gas shower head. The upper electrode 40 is held at the ceiling portion of the chamber 10 via an insulating member 42. The upper electrode 40 includes an electrode plate 44 and an electrode support 46. The electrode plate 44 faces the stage 12. The electrode support 46 is made of a conductive material such as aluminum having an alumite-treated (anodized) surface and is configured to detachably hold the electrode plate 44 at its lower side.

An edge side gas supplying zone 48 and a center side gas supplying zone 49 are respectively arranged at an outer periphery side and an inner periphery side (center side) within the electrode support 46. The edge side gas supplying zone 48 and the center side gas supplying zone 49 respectively communicate with multiple gas introduction holes 50 and gas introduction holes 51 that are formed at the electrode plate 44.

With such a configuration, gas supplied to the edge side gas supplying zone 48 may be showered into a plasma processing space U within the chamber 10 from the outer periphery side via the gas introduction holes 50. Also, gas supplied to the center side gas supplying zone 49 may be showered into the plasma processing space U from the center side via the gas introduction holes 51.

Note that a pipeline (not shown) for circulating a coolant may be arranged at the electrode support 46, for example, so that the upper electrode 40 may be cooled and adjusted to a desired temperature. Also, a heater (not shown) may be embedded within the electrode support 46, for example, so that the upper electrode 40 may be heated and adjusted to a desired temperature.

In the present embodiment, a gas chamber within the upper electrode 40 is divided into the center side gas supplying zone 49 corresponding to a circular-shaped zone arranged at the center side, and the edge side gas supplying zone 48 corresponding to an annular-shaped zone arranged at the outer periphery side. However, in other embodiments, the gas chamber within the upper electrode 40 may be divided into more than two gas supplying zones, for example. Also, the gas chamber within the upper electrode 40 may be subdivided in radial directions or circumferential directions. For example, the gas chamber within the upper electrode 40 may be subdivided radially into multiple gas supplying zones including an outermost periphery zone and one or more inner periphery zones, and processing gas may be introduced into the chamber 10 via each of these gas supplying zones.

A substantially disk-shaped ground member 70 is arranged above the electrode support 46 at a position facing the electrode support 46 via gas pipes 53 and 54. The ground member 70 is a conductor and may be made a conductive material such as aluminum, for example.

The edge side gas supplying zone 48 is connected to one end of the gas pipe 53. The center side gas supplying zone 49 is connected to one end of the gas pipe 54. The other end of the gas pipe 53 is connected to a second branch part 123. The other end of the gas pipe 54 is connected to a first branch part 122. Note that configurations of the gas pipes 53 and 54 are described in detail below.

A branch pipe 60 includes the first branch part 122 and the second branch part 123. Processing gas is branched out to the first branch part 122 and the second branch part 123 at a predetermined flow rate ratio and supplied to the center side gas supplying zone 49 and the edge side gas supplying zone 48, respectively. A flow rate adjusting apparatus 67 is attached to the branch pipe 60. The flow rate adjusting apparatus 67 divides processing gas from a gas supply source 68 that is mixed at a mixing pipe 120 according to a predetermined flow rate ratio and distributes the divided processing gas to the first branch part 122 and the second branch part 123 of the branch pipe 60. The flow rate adjusting apparatus 67 monitors the pressure within the first branch part 122 and the second branch part 123 after the processing gas is branched out to these branch parts and controls the flow rate of gas being branched out based on the monitoring results.

An addition pipe 130 is connected to at least one of the first branch part 122 or the second branch part 123 of the branch pipe 60 and is configured to add an adjustment gas to the processing gas. In the present embodiment, the addition pipe 130 is connected to the second branch part 123 of the branch pipe 60 and is configured to add $C_4F_8$ gas as the adjustment gas to the processing gas flowing through the second branch part 123. However, the present invention is not limited to such a configuration. In other embodiments, the addition pipe 130 may be connected to at least one branch part of the branch pipe 60 that communicates with the outermost periphery zone of the upper electrode 40, the addition pipe 130 may be connected to at least one branch part of the branch pipe 60 that communicates with at least one inner periphery zone, or the addition pipe 130 may be connected to a branch part of the branch pipe 60 communicating with all the gas supplying zones, for example.

A coolant flow path 14a is arranged within the support 14. A coolant such as cooling water may be circulated through the coolant flow path 14a to control the temperature of the substrate W at a predetermined temperature. Further, a pipe 22 for supplying a heat transfer gas such as helium (He) gas (back side gas) is arranged at a rear face of the substrate W.

An exhaust port 80 is provided at a bottom portion of the chamber 10. The exhaust port 80 is connected to an exhaust apparatus 82 via an exhaust pipe 81. The exhaust apparatus 82 includes a vacuum pump and is configured to maintain the atmosphere within the chamber to a predetermined vacuum atmosphere by activating the vacuum pump.

An inner wall of the chamber 10 is covered by a liner 83, which has a surface that is spray coated with a plasma resistant material. Further, a gate valve (not shown) configured to open and close to load/unload the substrate W is attached to a sidewall of the chamber 10.

A control unit 100 controls operations of the plasma processing apparatus 1 according to recipes. The control unit 100 may include a CPU (Central Processing Unit), a ROM (Read Only Memory) and a RAM (Random Access Memory) (not shown), for example. The CPU may control operations of various parts such as the first high frequency power supply 30, the first matching unit 31, the second high frequency power supply 35, the second matching unit 36, the gas supply source 68, and the flow rate adjusting apparatus 67 according to various recipes stored in the storage area of the ROM or the RAM, for example. In this way, the control unit 100 may implement a plasma process. The recipes may describe apparatus control information according to various processing conditions. For example, the recipes may include information relating to processing gas flow rates of various types of processing gases, processing time, processing chamber temperature (e.g., upper electrode temperature, side wall temperature of processing chamber, ESC temperature), pressure (gas exhaust), high frequency power and voltage, and heat transfer gas flow rate. Note that the functions of the control unit 100 may be implemented by software and/or hardware.

The control unit 100 controls operations of the plasma processing apparatus 1 so that gas introduced from the upper electrode 40 may be ionized or dissociated by the high frequency power for plasma generation that is output from the first high frequency power supply 30. In this way, plasma may be generated within the plasma processing space U. The generated plasma may be used to perform a desired plasma process such as etching on a processing object such as a wafer W that is placed on the stage 12.

Figure 2:
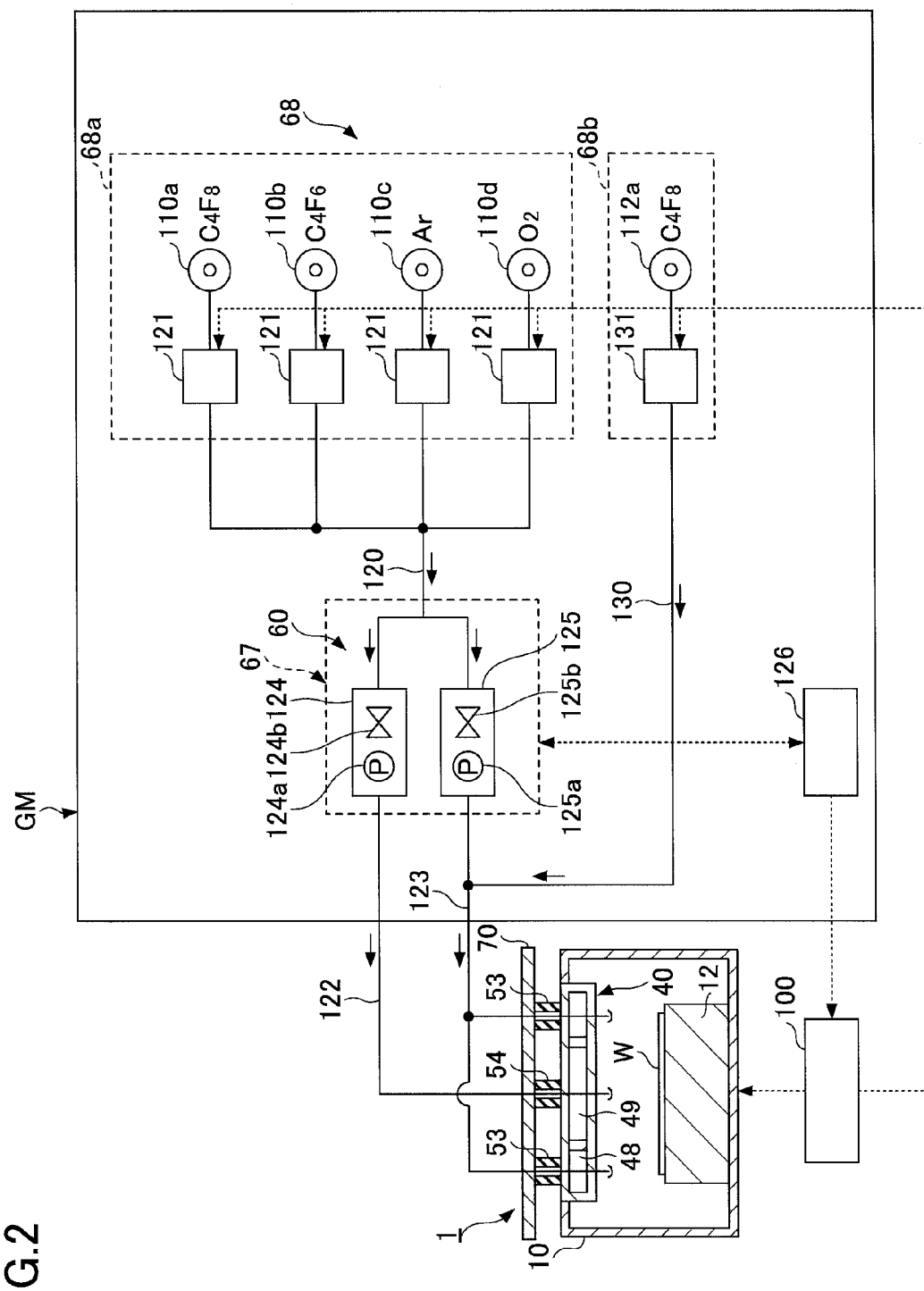
FIG. 2 illustrates a configuration of a gas supplying mechanism according to an embodiment of the present invention.

The overall configuration of the plasma processing apparatus 1 has been described above. In the following, a gas supplying mechanism according to an embodiment of the present invention is described with reference to FIG. 2. FIG. 2 illustrates an exemplary configuration of a gas supplying mechanism GM.

[Gas Supplying Mechanism]

The gas supplying mechanism GM includes the gas supply source 68, which includes a first gas box 68a and a second gas box 68b. For example, the first gas box 68a of the gas supply source 68 may accommodate four gas sources 110a, 110b, 110c, and 110d; and the second gas box 68b may accommodate one adjustment gas source 112a.

The gas supply sources 110a and 110b of the first gas box 68a respectively contain fluorocarbon ($C_XF_Y$) based fluorine compound gases such as $C_4F_8$ gas and $C_4F_6$ gas as etching gases. Examples of $C_XF_Y$ gases include $C_4F_6$ gas, $C_4F_8$ gas, and $C_5F_8$ gas. The gas supply source 110c contains a rare gas such as Ar gas as a carrier gas. The gas supply source 110d contains $O_2$ gas as a gas for controlling reaction products of fluorocarbon. The adjustment gas source 112a of the second gas box 68b may contain $C_4F_8$ gas as a $C_XF_Y$ gas for accelerating the etching rate.

The gas sources 110a-110d of the first gas box 68a are connected to the mixing pipe 120 where the gases supplied from the gas sources 110a-110d merge and are mixed together. The mixing pipe 120 includes a mass flow controller 121 for controlling the flow rate of gas flowing from each of the gas sources 110a-110d.

The mixing pipe 120 is connected to the branch pipe 60, which divides the flow of the gas mixed at the mixing pipe 120. The branch pipe 60 is divided into the first branch part 122 and the second branch part 123. The first branch part 122 is connected to the center side gas supplying zone 49 of the upper electrode 40 via the gas pipe 54. The second branch part 123 is further divided into multiple branch parts that are connected to the edge side gas supplying zone 48 of the upper electrode 40 via multiple gas pipes 53.

The flow rate adjusting apparatus 67 includes pressure adjusting parts 124 and 125. The first branch part 122 is connected to the pressure adjusting part 124, and the second branch part 123 is connected to the pressure adjusting part 125. The pressure adjusting part 124 includes a pressure gauge 124a and a valve 124b, and the pressure adjusting part 125 includes a pressure gauge 125a and a valve 125b. The measurement result of the pressure gauge 124a and the measurement result of the pressure gauge 125a are output to a pressure ratio control apparatus 126. The pressure ratio control apparatus 126 adjusts the opening degree of the valves 124b and 125b based on the measurement results of the pressure gauges 124a and 125a, and controls the pressure ratio of gas that is branched out to the first branch part 122 and the second branch part 123 to thereby control the flow rate ratio of the gas.

The adjustment gas source 112a of the second gas box 68b is connected to the addition pipe 130, which is connected to the second branch part 123. The addition pipe 130 is connected to the second branch part 123 at the downstream side of the pressure gauge 125. That is, the addition pipe 130 is connected to the second branch part 123 at a point between the flow rate adjusting apparatus 67 and the gas pipe 53 and is configured to add adjustment gas to the processing gas that is flow-rate-adjusted by the flow rate adjusting apparatus 67. A mass flow controller 131 is arranged at the addition pipe 130 for adjusting the flow rate of the adjustment gas that is supplied thereto from the adjustment gas source 112a. With such a configuration, adjustment gas of the second gas box 68b may be supplied to the second branch part 123.

Operations of the mass flow controllers 121 at the first gas box 68a and the mass flow controller 131 at the second gas box 68b are controlled by the control unit 100 via the flow rate adjusting apparatus 67 and the pressure ratio control apparatus 126. Thus, the control unit 100 may start and stop operations for supplying the different types of gases from the first gas box 68a and the second gas box 68b and control the flow rates of the different gases.

Figure 3:
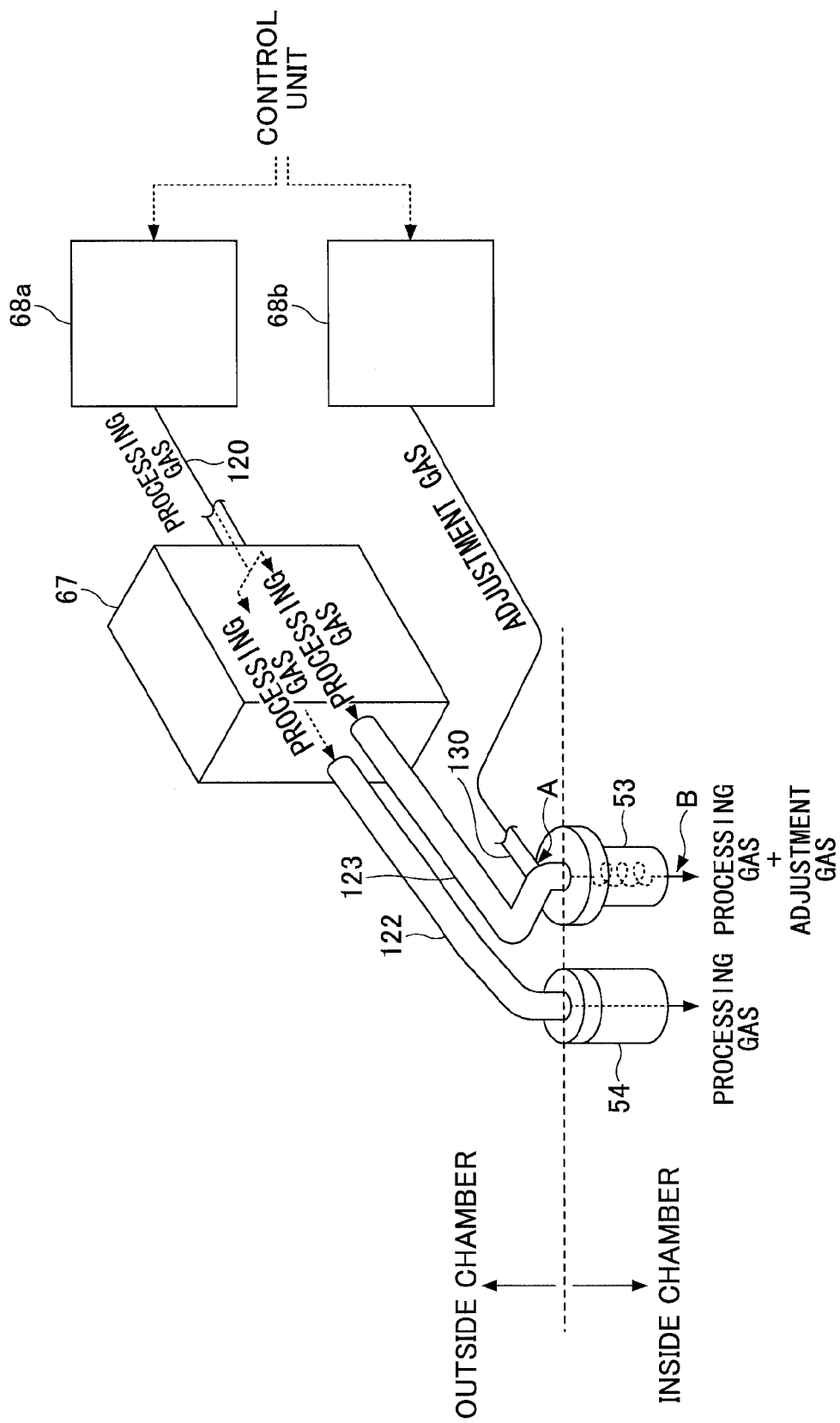
FIG. 3 illustrates an arrangement of a flow rate adjusting apparatus, a branch pipe, an addition pipe, and a gas pipe according to an embodiment of the present invention.

In the following, operations of the gas supplying mechanism GM having the above-described configuration are described with reference to FIGS. 2 and 3. FIG. 3 illustrates an exemplary arrangement of the flow rate adjusting apparatus 67, the branch pipe 60, the addition pipe 130, and the gas pipes 53 and 54 according to an embodiment of the present invention.

First, in response to a command signal from the control unit 100, pre-designated gases within the first gas box 68a are output at predetermined flow rates to the mixing pipe 120. For example, $C_4F_8$ gas, $C_4F_6$ gas, Ar gas, and $O_2$ gas may be output at predetermined flow rates from the gas sources 110a-110d, respectively, and the output gases may be mixed at the mixing pipe 120 so that a gas mixture of $C_4F_8$ gas, $C_4F_6$ gas, Ar gas, and $O_2$ gas may be generated.

Then, based on measurement results obtained by the pressure gauges 124a and 125a illustrated in FIG. 2, the pressure ratio control apparatus 126 adjusts the opening degree of the valves 124b and 125b so that the pressure ratio of the gas mixture flowing into the first branch part 122 and the second branch part 123 may be adjusted to a target ratio. In this way, the gas composition (mix ratio) and flow rate may be set up for the gas mixture supplied to the center side gas supplying zone 49 from the first branch part 122. Also, at this point, the same gas mixture supplied to the center side gas supplying zone 49 (i.e., gas mixture for enabling a plasma process) is supplied to the edge side gas supplying zone 48 from the second branch part 123.

After the pressure ratio of the gas mixture flowing into the first branch part 122 and the second branch part 123 is adjusted to the target pressure ratio and stabilized, the pressure ratio control apparatus 126 fixes the opening degrees of the valves 124b and 125b of the pressure adjusting parts 124 and 125. At the time the opening degrees of the valves 124b and 125b are fixed, the control unit 100 issues a command signal to prompt a pre-designated adjustment gas within the second gas box 68b to flow into the addition pipe 130 at a predetermined flow rate. The command signal for starting the supply of the adjustment gas from the second gas box 68b may be output by the control unit 100 according to a recipe. For example, $C_4F_8$ gas for accelerating the etching rate may be supplied from the adjustment gas source 112a via the addition pipe 130 to the second branch part 123, which communicates with the edge side gas supplying zone 48. In this case, gas mixture containing $C_4F_8$ gas at a higher ratio than the gas mixture supplied to the center side gas supplying zone 49 may be supplied to the edge side gas supplying zone 48 via the gas pipe 53. In this way, the gas composition (mix ratio) and flow rate may be set up for the gas mixture supplied to the edge side gas supplying zone 48 from the second branch part 123. Note that although the pressure ratio of gas supplied to the first branch part 122 and the second branch part 123 changes as a result of adding the adjustment gas to the second branch part 123, because the opening degrees of the valves 124b and 125b are fixed, the gas mixture may still be supplied to the center side gas supplying zone 49 via the gas pipe 54 at the initial flow rate.

In the plasma processing apparatus 1, a gas mixture is supplied, under a reduced-pressure atmosphere, from the center side gas supplying zone 49 to a region near a center portion of the plasma processing space U. Also, a gas mixture containing a higher concentration of $C_4F_8$ gas than the gas mixture supplied from the center side gas supplying zone 49 is supplied from the edge side gas supplying zone 48 to an outer periphery portion of the wafer W. In this way, the etching rate (etching characteristic) at the outer periphery portion of the wafer W may be accelerated relative to the etching rate at a center portion of the wafer W so that in-plane etching uniformity may be improved upon etching the wafer W.

In the above-described embodiment, multiple types of gases supplied from the first gas box 68a are mixed at the mixing pipe 120 and the resulting gas mixture (processing gas) are branched out to the first branch part 122 and the second branch part 123 to be supplied to the center side gas supplying zone 49 and the edge side gas supplying zone 48, respectively. An adjustment gas for adjusting an etching rate is added to the gas mixture flowing in the second branch part 123 so that a gas mixture having a different composition (mix ratio) from that of the gas mixture supplied to the center side gas supplying zone 49 may be supplied to the edge side gas supplying zone 48 at a different flow rate. According to an aspect of the present embodiment, the gas composition and the flow rate of the gas mixtures supplied to the center side gas supplying zone 49 and the edge side gas supplying zone 48 may be arbitrarily adjusted using a simple pipe structure.

[Gas Pipe]

The following descriptions relate to use of the above-described gas supplying mechanism GM in connection with adding an adjustment gas via the addition pipe 130, which is connected to the second branch part 123 of the branch pipe 60.

A case is considered below in which an adjustment gas with a relatively large molecular weight is added to a processing gas containing a main gas with a relatively small molecular weight, the processing gas being supplied from the first gas box 68a to the second branch part 123. In the case of mixing gases with substantially different molecular weights, the gases cannot be mixed together as easily as in the case of mixing gases with similar molecular weights. That is, it takes a longer time to completely mix gases with substantially different molecular weights compared to the case of mixing gases with similar molecular weights. Thus, the gases with substantially different molecular weights may be introduced into the plasma processing space U within the chamber 10 via gas introduction holes 50 of the gas shower head (upper electrode 40) before the gases are adequately mixed together. In such case, variations may occur in the mix ratio (gas concentration) of the gas mixture introduced into the chamber 10 from the gas shower head. As a result of such non-uniformity in the gas concentration, processing uniformity may be compromised, for example.

As a countermeasure against such a problem, the length of the branch pipe 60 connected to the addition pipe 130 may be increased so as to secure adequate reaction time for the gases to be completely mixed before being introduced into the chamber 10. However, the flow rate adjusting apparatus 67 performs gas flow rate control operations for adjusting the flow rates of processing gas branched out to the first branch part 122 and the second branch part 123 of the branch pipe 60 by monitoring the pressures within the first branch part 122 and the second branch part 123 after the processing gas is branched out to these branch parts. Accordingly, in order to promptly monitor pressure variations within the first branch part 122 and the second branch part 123 after the processing gas is branched out to the first branch part 122 and the second branch part 123 and reflect the monitoring results in the gas flow rate control operations, the pipe lengths of the first branch part 122 and the second branch part 123 are preferably arranged to be as short as possible. Thus, lengthening the branch pipe 60 to a length that allows for an adequate reaction time for the gases to be completely mixed may not be practicable in consideration of the need to ensure accuracy of the gas flow rate control operations by the flow rate adjusting apparatus 67.

As an alternative measure, an orifice may be provided within the second branch part 123 so that gas may be temporarily retained within the second branch part 123. In this way, a delay may be created before the gas is flown out of the second branch part 123, and the delay time may be used to mix the gases together. However, in this case, variations may occur in the conductance of the second branch part 123 and this may affect the pressure within the second branch part 123. That is, the orifice within the second branch part 123 may cause variations in the pressure value detected by the pressure gauge provided within the flow rate adjusting apparatus 67 so that the accuracy of the gas flow rate control operations of the flow rate adjusting apparatus 67 may be degraded as a result. Accordingly, arranging a member that causes substantial variations in the conductance of the second branch part 123 may not be practicable. Further, simply increasing the length of the branch pipe 60 linearly may not be compatible with aims to achieve a more compact design and miniaturization of the plasma processing apparatus.

According to an embodiment of the present invention, the gas pipe 53 that is connected to the second branch part 123 to which the addition gas 130 is connected includes a bending portion for preventing gas concentration variations according to the molecular weight ratio of the adjustment gas to the main gas. In this way, as illustrated in FIG. 3, the gas pipe 53 may increase the distance from a connection portion A between the second branch part 123 and the addition pipe 130 to a gas outlet B of the gas pipe 53 to thereby secure enough reaction time for the processing gas and the adjustment gas to be completely mixed before the gas mixture is introduced into the chamber 10. In the following, a configuration of the gas pipe 53 is described in detail with reference to FIG. 4.

Figure 4:
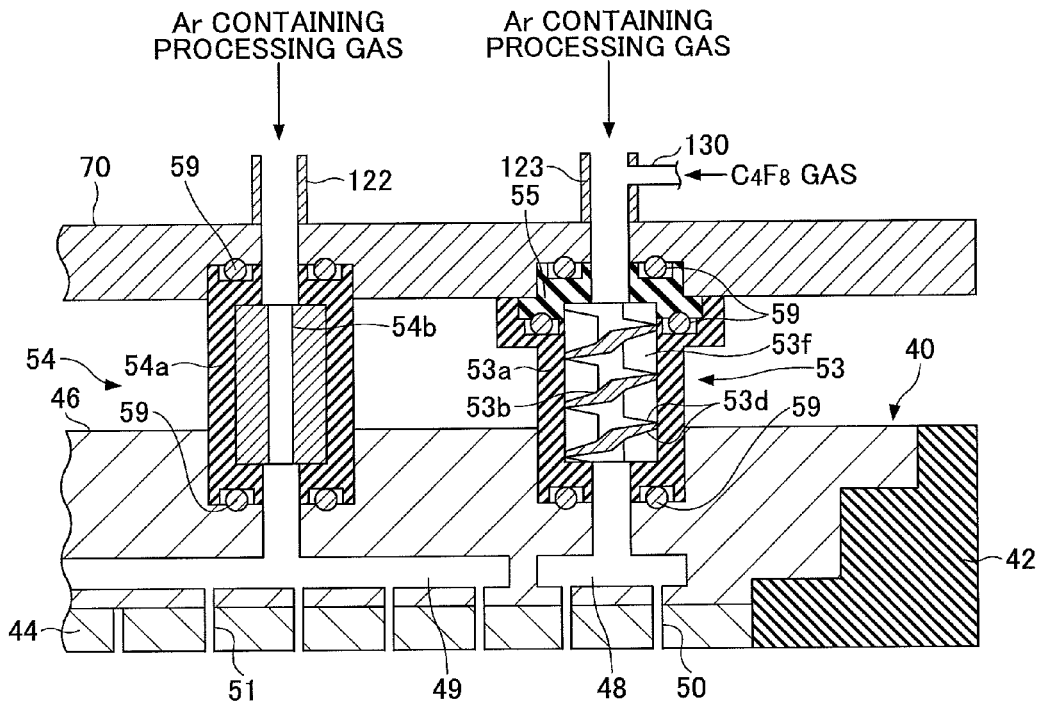
FIG. 4 is a cross-sectional view of the gas pipe according to an embodiment of the present invention.

As described above, the gas pipes 53 and 54 of the plasma processing apparatus 1 are arranged between the upper electrode 40 and the ground member 70, which is arranged outside the chamber 10 at a position facing the upper electrode 40. FIG. 4 illustrates an exemplary case where the gas pipes 53 and 54 have different internal configurations.

The gas pipe 53 is for passing a gas mixture of a processing gas containing Ar gas as a main gas with a small molecular weight and $C_4F_8$ gas as an adjustment gas with a large molecular weight. The gas pipe 53 includes a cylindrical member 53a that is made of an insulating material and a drill-shaped member 53b that is fit into the cylindrical member 53a. With such a configuration, a spiral gas flow path 53f is formed inside the gas pipe 53. The spiral gas flow path 53f formed within the gas pipe 53 corresponds to an exemplary embodiment of a bending portion 53d formed at the gas pipe 53.

A relatively wide opening portion is formed at the upper end of the cylindrical member 53a. The gas pipe 53 may be supported by the ground member 70 by fitting an engagement member 55, which engages a concave part of the ground member 70, into this opening portion. The lower end of the gas pipe 53 is arranged to engage a concave portion of the electrode support 46. The concave portion of the electrode support 46 is connected to the edge side gas supplying zone 48. In this way, the gas flow path 53f of the gas pipe 53 may communicate with the second branch part 123 and the edge side gas supplying zone 48. The gas pipe 53 is sealed by O-rings 59 so that the vacuum atmosphere within the chamber 10 may be maintained.

Although it is normally difficult to mix together gases with substantially different molecular weights, the gas pipe 53 is arranged to have a gas flow path 53f with a spiral structure that is designed so that the gas flow path length may be as long as possible with respect to the perpendicular direction of the gas pipe 53 and the volume of the gas flow path 53f may be as large as possible (to improve conductance) within the bounds of machining capabilities and mechanical strength requirements. With such a configuration, while maintaining the conductance to at least a predetermined level, the gas mixture of the processing gas flowing from the second branch part 123 and the adjustment gas flowing from the addition pipe 130 may gradually be diffused while passing through the spiral gas flow path 53f within the gas pipe 53 and molecules of the gases may repeatedly collide with each other or with the inner wall of the gas pipe 53 to be mixed together. The gas mixture is then introduced to the edge side gas supplying zone 48. By the time the gas mixture is introduced into the chamber 10 via the gas introduction hole 50, the gas mixture may be completely mixed together to reach a uniform gas concentration; i.e., a target gas concentration of the gas mixture of the processing gas and the adjustment gas. In one preferred embodiment, a heater (not shown) embedded in the upper electrode 40, for example, may be used to control the gas pipe 53 to maintain a high temperature environment. In this way, the molecular activity of the gases may be intensified so that the frequency of molecular collision may be increased and mixing of the gases within the spiral flow path of the gas pipe 35 may be further accelerated despite the limited space within the gas pipe 53. In this way, the gas mixture of the processing gas and the adjustment gas to may be mixed with greater efficiency to reach a uniform gas concentration upon being introduced into the chamber 10.

In order to secure enough reaction time for completely mixing together a processing gas containing a main gas and an adjusting gas that have substantially different molecular weights so that the gas mixture may reach a target gas concentration as described above, the flow path length of the gas pipe 53 is preferably arranged to be at least 150 mm. The underlying reasons for such an arrangement is described in detail below.

In the present embodiment, the gas pipe 54 is for passing a processing gas that does not have an adjustment gas added thereto. The gas pipe 54 includes a cylindrical member 54a made of an insulating material and a tubular member 54b with a through hole. The tubular member 54b is fit into the cylindrical member 54a. The gas pipe 54 is sealed by O-rings 59 so as to maintain the vacuum atmosphere within the chamber 10.

Processing gas flowing from the first branch part 122 passes the gas pipe 54 to be introduced into the center side gas supplying zone 49 to then be introduced into the chamber 10 via the gas introduction hole 51. The processing gas passing through the gas pipe 54 does not contain an adjustment gas having a molecular weight that substantially varies from the molecular weight of the main gas of the processing gas. Normally, gases with similar molecular weights can be easily mixed together. Accordingly, even though a gas flow path 53f within the gas pipe 54 is not lengthened as in the gas pipe 53 described above, the processing gas may be completely mixed by the time it is introduced into the chamber 10 via the gas introduction hole 51 so that a processing gas at a uniform gas concentration may be introduced into the chamber 10.

[Gas Concentration Uniformity of Gas Mixture at Gas Supplying Zone]

In the following, gas concentration uniformity of a gas mixture of gases with substantially different molecular weights supplied to the gas supplying zones is described with reference to FIGS. 5-8B.

Figure 5:
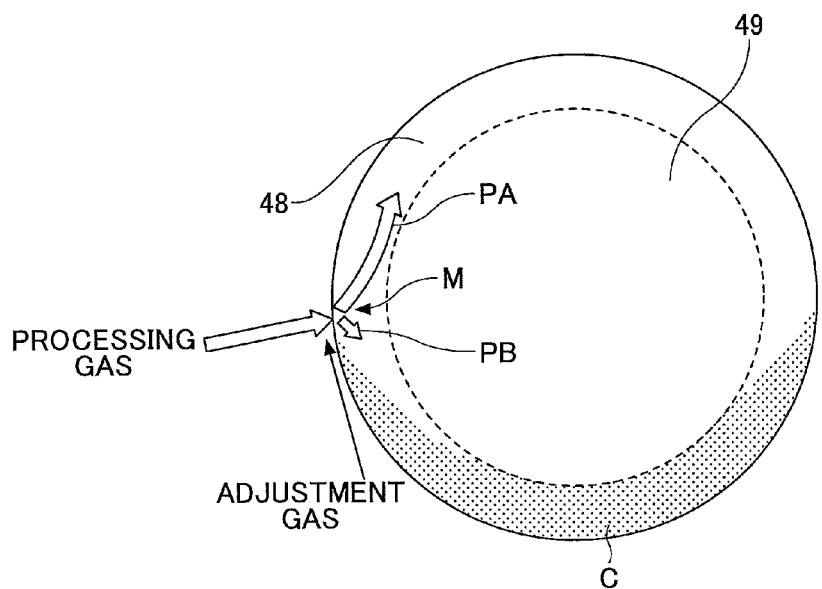
FIG. 5 illustrates flow directions of a processing gas and an adjustment gas being supplied to an edge side gas supplying zone and a disproportionate gas concentration of the gases at the edge side gas supplying zone.

First, a conceptual explanation is provided below relating to how the gas concentration of a gas mixture of gases supplied to the edge side gas supplying zone 48 becomes disproportionate under the gas condition indicated below due to the configuration of a gas merging point M as illustrated in FIG. 5. The gas merging point M is a conceptual illustration of a portion at which the processing gas and the adjustment gas within the gas pipe 53 merge. FIG. 5 illustrates an exemplary case in which the gas flow path of the gas pipe 53 does not have a bending portion. Also, in FIG. 5, the length of the gas flow path of the gas pipe 53 is arranged to be less than 150 mm.

Gas Flow Rate Ratio Condition (flow rate ratio assuming the flow rate of adjustment gas $C_4F_8$ is equal to 1)

Processing Gas: $C_4F_8/C_4F_6/Ar/O_2$=0/0/100/4.2

Adjustment Gas: $C_4F_8$=1

Under the above gas condition (gas flow rate ratio condition), Ar gas of the processing gas with the highest flow rate of 100 corresponds to a main gas of the processing gas, and the substantial molecular weight of the processing gas corresponds to the molecular weight 44 of Ar gas. On the other hand, the molecular weight of $C_4F_8$ gas used as the adjustment gas is 200, which is 4.54 times greater than the molecular weight of Ar gas. That is, Ar gas as the main gas and $C_4F_8$ gas as the adjustment gas have substantially different molecular weights so that these gases may not be easily mixed together.

In the experiment illustrated in FIG. 5, the center side gas supplying zone 49 was closed and gases with the above gas conditions were supplied only to the edge side gas supplying zone 48. As illustrated in FIG. 3 (connection part A), the second branch part 123 and the addition pipe 130 are connected to be substantially perpendicular to each other. In the case where the connection part A is arranged to have such a configuration, the processing gas containing Ar gas as the main gas supplied from the second branch part 123 is supplied in a radial direction with respect to the edge side gas supplying zone 48 whereas the $C_4F_8$ gas as the adjustment gas is supplied in a direction substantially perpendicular to the flow direction of the processing gas; i.e., a circumferential direction with respect to the edge side gas supplying zone 48 (see FIG. 5).

At the gas merging point M of the gases, the adjustment gas with the greater molecular weight pushes the main gas with the smaller molecular weight toward the circumferential direction (PA direction in FIG. 5) corresponding to the direction in which the adjustment gas is introduced into the edge side gas supplying zone 48. Also, the concentration of the adjustment gas increases at a region C toward direction PB corresponding to the opposite direction with respect to the direction in which the adjustment gas is introduced. As a result, the reaction rate is accelerated at region C. In this way, region C with a disproportionate gas concentration is created along the circumferential direction of the edge side gas supplying zone 48.

FIGS. 6A-8B illustrate experimental results of experimentally altering process conditions to correct such non-uniformity of the gas concentration in the circumferential direction of the edge side gas supplying zone 48. In these experiments, the gas concentration uniformity in the circumferential direction of the edge side gas supplying zone 48 is represented by a difference in the variability of an etching rate ER in the circumferential direction of the edge side gas supplying zone 48 as expressed by the following formula:

Gas Concentration Uniformity (%)=(Max−Min)/(Max+Min)×100

Max: maximum value of etching rate ER in the circumferential direction

Min: minimum value of etching rate ER in the circumferential direction

The gas concentration uniformity (%) is evaluated based on the in-plane uniformity of the etching rate of etching a wafer W with plasma. When the gas concentration is uniform, the etching rate distribution of etching the wafer W with plasma may also be uniform in a correlated way so that the above gas concentration uniformity (%) may be a small value.

In the following, measurement results of the gas concentration uniformity in the circumferential direction of the edge side gas supplying zone 48 obtained upon altering the process conditions are described. Note that in the following descriptions, the edge side gas supplying zone 48 may simply be referred to as "edge side" and the center side gas supplying zone 49 may simply be referred to as "center side".

Because the etching rate at the edge side is lower than the etching rate at the center side, the adjustment gas is added to the processing gas supplied to the edge side gas supplying zone 48 to accelerate the etching rate at the edge side. Note that the gas concentration uniformity is ideally 1% but desirable etching characteristics may still be obtained and gas concentration uniformity in the circumferential direction at the edge side may still be maintained as long as the gas concentration uniformity is less than or equal to 1.3%.

[Gas Concentration Uniformity]

(Addition of Adjustment Gas)

FIGS. 6A and 6B illustrate experimental results of examining how the gas concentration uniformity varies depending on the flow rate of the adjustment gas. The process conditions used in the experiment of FIGS. 6A and 6B are indicated below. Note that in each of the experiments of FIGS. 6A-8B described below, the same predetermined high frequency powers from the first high frequency power supply 30 and the second high frequency power supply 35 were applied under the same predetermined pressure conditions.

<Process Conditions>

Condition A

Adjustment gas $C_4F_8$ is not added

Condition B (flow rate ratio assuming the flow rate of adjustment gas $C_4F_8$ is equal to 1)

Processing Gas: $C_4F_8/C_4F_6/Ar/O_2$=3/0.8/100/4.2

Adjustment Gas: $C_4F_8$=1 (added to edge side but not added to center side)

Condition C (flow rate ratio assuming the flow rate of adjustment gas $C_4F_8$ is equal to 1)

Processing Gas: $C_4F_8/C_4F_6/Ar/O_2$=1.5/0.4/50/2.1

Adjustment Gas: $C_4F_8$=1 (added to edge side but not added to center side)

Note that in implementing the above process conditions A-C, the edge side/center side flow rate ratio was set equal to 80/20.

In FIG. 6A, condition A represents a case where the adjustment gas $C_4F_8$ is not added to the above-described processing gas containing Ar gas as the main gas; condition B represents a case where the adjustment gas $C_4F_8$ is added to the processing gas according to the above gas flow rate ratio condition; and condition C represents a case where the adjustment gas $C_4F_8$ is added to the processing gas according to the above gas flow rate ratio condition.

When experiments were conducted under the conditions A, B, and C, the resulting gas concentration uniformities were respectively "0.9%", "5.8%", and "7.4%". These experimental results are represented by a graph in FIG. 6B. These results indicate that under condition A where the adjustment gas $C_4F_8$ is not added, the gas concentration uniformity is below 1.3%, which means that the gas concentration is maintained substantially uniform.

However, under process conditions B and C where the adjustment gas $C_4F_8$ is added, the gas concentration uniformity is substantially greater than 1.3%, which means that the gas concentration is not maintained substantially uniform. Also, as the flow rate of the adjustment gas $C_4F_8$ is increased, the variability of the gas concentration becomes greater and the gas concentration uniformity at the edge side is further degraded.

(Edge Side/Center Side Flow Rate Ratio)

FIGS. 7A and 7B illustrate experimental results of examining how the gas concentration uniformity varies depending on the gas flow rate ratio of gas branched out to the edge side and the center side. The process conditions used in the experiment of FIGS. 7A and B are indicated below.

<Process Conditions>

Condition D (flow rate ratio assuming the flow rate of adjustment gas $C_4F_8$ is equal to 1)

Processing Gas: $C_4F_8/C_4F_8/Ar/O_2=3/0.8/100/4.2$

Adjustment Gas: $C_4F_8=1$ (added to edge side but not added to center side)

Edge Side/Center Side Flow Rate Ratio=80/20

Condition E

Edge Side/Center Side Flow Rate Ratio=50/50 (other conditions are identical to those of condition D)

Condition F

Edge Side/Center Side Flow Rate Ratio=20/80 (other conditions are identical to those of condition D)

In FIG. 7A, condition D represents a case where the edge side/center side flow rate ratio is 80/20; condition E represents a case where the edge side/center side flow rate ratio is 50/50; condition F represents a case where the edge side/center side flow rate ratio is 20/80. When experiments were conducted under the conditions D, E, and F, the resulting gas concentration uniformities were respectively "5.8%", "3.0%", and "1.4%". These experimental results are represented by a graph in FIG. 7B. These results indicate that the gas concentration uniformity is at its worst under condition D where the flow rate ratio at the edge side is set higher than the flow rate ratio at the center side, and the gas concentration uniformity is improved as the flow rate ratio at the edge side is decreased with respect to the flow rate ratio at the center side as in conditions E and F, for example. Under condition F where the edge side/center side flow rate ratio is 20/80, the gas concentration uniformity is substantially close to 1.3% indicating that the gas concentration is maintained substantially uniform. The degree of disproportion of the gas concentration becomes greater as the gas flow rate at the edge side is increased because the adjustment gas $C_4F_8$ having a molecular weight substantially different from the molecular weight of the main gas Ar is added at the edge side and these gases cannot be easily mixed together. Particularly, when the flow rate at the edge side is increased, the gas flow is accelerated at the edge side thereby making it more difficult for the gases to mix together. On the other hand, when the gas flow rate at the edge side is decreased, the gas flow at the edge side slows down so that the gases can be more easily mixed together.

(Pipe Length)

FIGS. 8A and 8B illustrate experimental results of examining how the gas concentration uniformity varies depending on the gas pipe length. The process conditions used in the experiment of FIGS. 8A and 8B are indicated below.

<Process Conditions>

Condition G (flow rate ratio assuming the flow rate of adjustment gas $C_4F_8$ is equal to 1)

Processing Gas: $C_4F_8/C_4F_8/Ar/O_2=3/0.8/100/4.2$

Adjustment Gas: $C_4F_8=1$ (added to edge side but not added to center side)

Edge Side/Center Side Flow Rate Ratio=80/20

Gas pipe length is 52.5 mm and the gas flow path is linear

Condition H

Gas pipe length is 150 mm and the gas flow path is linear (other conditions are identical to those of condition G)

Condition I

Gas pipe length is 500 mm and the gas flow path is linear (other conditions are identical to those of condition G)

Condition J

Gas pipe length is 275 mm and the gas flow path is spiral (other conditions are identical to those of condition G)

In FIG. 8A, condition G represents a case where the gas pipe length is 52.5 mm; condition H represents a case where the gas pipe length is 150 mm; and condition I represents a case where the gas pipe length is 500 mm. When experiments were conducted under conditions G, H, and I, the resulting gas concentration uniformities were respectively "5.8%", "1.2%", and "1.0%". These experimental results are represented by a graph in FIG. 8B. These results indicate that the gas concentration uniformity is at its worst under condition G where the gas pipe length is 52.5 mm. Under conditions H and I where the pipe length is at least 150 mm, the gas concentration uniformity is close to 1% indicating that the gas concentration is maintained substantially uniform. It can be appreciated from the above results that adequate reaction time for completely mixing the gases under the above gas conditions may be secured when the gas pipe length is at least 150 mm.

When the gas pipe length is lengthened to 500 mm as in condition I, the gas concentration may be completely uniform. However, arranging a gas pipe with a length of 500 mm on top of the chamber of a plasma processing apparatus is impracticable in view of the need to arrange various other external components on the limited space at the top portion of the chamber and the need to remove the top of the chamber upon maintenance, for example.

The experimental results illustrated in FIG. 8B indicate that sufficient gas concentration uniformity may be obtained when the gas pipe length is at least 150 mm. Based on these results, the inventors of the present invention have conducted further experimentation including experiments under condition J where the gas flow path of the gas pipe 53 is arranged into a spiral structure. The inventors were able to confirm that when the flow path was arranged to have such a configuration, a maximum feasible length L of the gas pipe without degrading conductance was 275 mm and in such case, the gas concentration uniformity was 1.3% meaning the gas concentration was maintained substantially uniform. Also, the linear distance from the inlet to the outlet of the gas pipe 53 having the flow path arranged into such a spiral structure was 60 mm. That is, by arranging the flow path within the gas pipe 53 into a spiral structure, the space above the chamber 10 for arranging the gas pipe 53 could be reduced by approximately ¼ (60/275).

[Distance for Securing Reaction Time for Completely Mixing Ar Gas and $C_4F_8$ Gas]

The following descriptions relate to calculating a distance L for securing a reaction time t required for Ar gas as the main gas of the processing gas and $C_4F_8$ gas as the adjustment gas that enter the inlet of the gas pipe 53 to be completely mixed together upon flowing out of the outlet of the gas pipe 53.

Formula (1) indicated below applies to situations where a substance increases/decreases as a result of a reaction.

Accumulation Speed=Inflow Speed−Outflow Speed+ Generation Speed (1)

Figure 9:
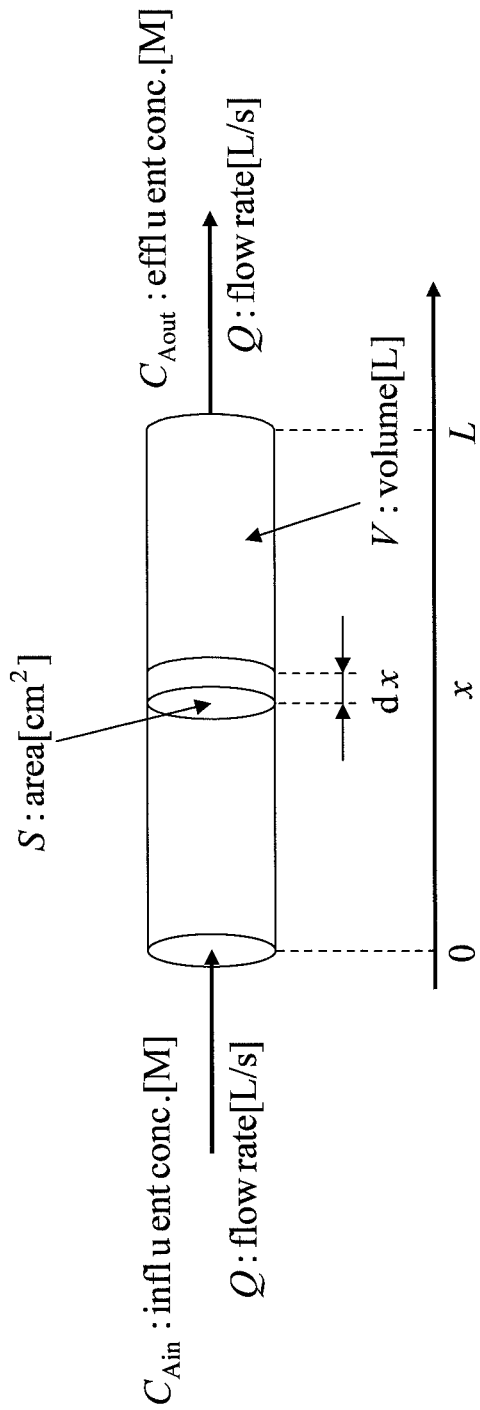
FIG. 9 illustrates a pipe length that is required for a gas mixture to reach a target gas concentration.

A gas mixture state in the case where a gas mixture of Ar gas and $C_4F_8$ gas flows through a gas pipe is described below with reference to FIG. 9. Variables illustrated in FIG. 9 are given the following definitions:

$C_{Ain}$: influent concentration [M] (gas concentration at gas pipe inlet)

$C_{Aout}$: effluent concentration [M] (gas concentration at gas pipe outlet)

Q: gas flow rate [L/s] at gas pipe inlet/outlet (constant)

S: gas pipe cross-sectional area [cm$^2$]

L: gas pipe length [mm]

The gas pipe inlet at x=0 in FIG. 9 is where the Ar gas and the $C_4F_8$ gas enter the gas pipe. At the gas pipe inlet, the Ar gas and the $C_4F_8$ gas are not yet mixed together so that the gas concentration of the gas mixture may vary.

The Ar gas and the $C_4F_8$ gas entering the gas pipe from the gas pipe inlet are gradually diffused within the gas pipe and molecules of the gases repeatedly collide with each other or with the inner wall of the gas pipe. At the gas pipe outlet, the Ar gas and the $C_4F_8$ gas are completely mixed together and reach a uniform gas concentration; i.e., a target concentration of the gas mixture of the Ar gas and the $C_4F_8$ gas. The gas pipe length (longitudinal distance) at which the gas mixture reaches the target concentration is denoted as L.

As can be appreciated from the above, the gas concentration at 0≤x<L within the gas pipe is not uniform. In the following descriptions, it is assumed that the gas concentration is uniform within a small cubic section between a given distance x from the gas pipe inlet and a distance x+dx slightly farther than the given distance x as illustrated in FIG. 9. A steady state is maintained within this small cubic section so that the gas concentration does not vary at points within this small cubic section. Accordingly, the accumulation speed of the above formula (1) is equal to 0 within this small cubic section. Further, the inflow, outflow, and generation speeds of formula (1) within the small cubic section may be obtained as follows:

Accumulation Speed=0

Inflow Speed=$C_A|xQ$

Outflow Speed=$C_A|x+dxQ$

Generation Speed=$r_A Sdx$

Note that $r_A$ represents a reaction speed [M/s].

By substituting the above into formula (1) and dividing both sides by dxQ, the following formula (2) may be obtained:

$(C_A|x+dx−C_A|x)/dx=dC_A/dx=r_A S/Q$ (2)

When x=0, $C_A=C_{Ain}$, and when x=L, $C_A=C_{Aout}$, and thus, by integrating formula (2), the following formula (3) may be derived:

$$\int_{C_{Aout}}^{C_{Ain}} \frac{dC_A}{r_A} = \frac{S}{Q}\int_0^L dx = \frac{SL}{Q} = \frac{V}{Q} = t \quad (3)$$

Note that t represents the reaction time (constant) for the gas mixture of the Ar gas and the $C_4F_8$ gas to reach the target gas concentration.

In general, the reaction speed depends on the n$^{th}$ power of the concentration of a subject substance A and may be expressed by the following formula (4):

$r_A = dC_A/dt = \pm k C_A^n$ (4)

Note that k represents a diffusion coefficient.

Considering a case where the subject substance A is reduced in a first-order reaction, the value of n of formula (4) is equal to 1 in this case because the subject reaction is a first-order reaction, and the right side of formula (4) is negative (−) because the subject substance A is reduced in the first-order reaction. Thus, the following formula (5) may be obtained:

$r_A = −kC_A$ (5)

By substituting formula (5) into formula (3), the following formula (6) may be obtained:

$Ln(C_{Ain}/C_{Aout}) = −kt$ (6)

By using the equation "SL/Q=V/Q=t" of formula (3), the reaction time t for the gas mixture to reach the target gas concentration may be calculated based on the volume V of the gas pipe and the flow rate Q. Based on the calculated reaction time t and formula (6), the gas pipe inlet-to-outlet gas concentration ratio $C_{Ain}/C_{Aout}$ of the Ar gas and the $C_4F_8$ gas may be obtained.

Based on the experimental results described above, the distance L is preferably at least 150 mm. Thus, for example, the type of gas to be mixed and the gas flow rate may be determined by obtaining the allowable gas concentration ratio $C_{Ain}/C_{Aout}$ when L=150 mm.

Also, by calculating the gas pipe inlet-to-outlet gas concentration ratio $C_{Ain}/C_{Aout}$; i.e., the change rate of the gas concentration before and after the Ar gas and the $C_4F_8$ gas are mixed, the calculated gas concentration ratio $C_{Ain}/C_{Aout}$ may be substituted into formula (6) and the reaction time t for the gas mixture of the Ar gas and the $C_4F_8$ gas to reach the target gas concentration may be calculated. By substituting the calculated reaction time t into formula (3), the distance L of the gas pipe for enabling the gas mixture of the Ar gas and the $C_4F_8$ gas to reach the target gas concentration may be obtained.

Based on the above, according to an embodiment of the present invention, the gas flow path of the gas pipe 53 that is connected to the second branch part 123 to which the addition pipe 130 is connected may be arranged to have the distance L such that the gas mixture of the adjustment gas and the main gas entering the inlet of the gas pipe 53 exits the outlet of the gas pipe 53 upon or after the elapse of the reaction time t required for the gas mixture to reach a uniform gas concentration (target gas concentration).

According to another embodiment, the control unit 100 may be configured to calculate the reaction time t required for the gas mixture of the adjustment gas and the main gas entering the inlet of the gas pipe 53 to reach a uniform gas concentration at the outlet of the gas pipe 53 when using the gas pipe 53 having a distance of at least 150 mm, calculate the main gas-to-adjustment gas concentration ratio based on the calculated reaction time t, and control the gas concentrations of the main gas and the adjustment gas to be within the calculated main gas-to-adjustment gas concentration ratio.

As described above, according to an aspect of the present invention, of the multiple gas pipes 53 and 54 that supply gas to the multiple gas supplying zones 48 and 49, at least the gas pipe 53 that communicates with the second branch part 123 to which the addition pipe 130 is connected has a flow path including a bending portion 53d with a spiral structure. In this way, the gas flow path 53f of the gas pipe 53 may be lengthened and a gas concentration variation according to the molecular weight ratio of the Ar gas to the $C_4F_8$ gas may be prevented.

Modified Embodiments

In the above-described embodiment, the $C_4F_8$ gas for accelerating the etching rate is supplied to the second branch part 123. However, there may be cases where fluorocarbon ($C_XF_Y$) based reaction products tend to accumulate at the center side of a wafer W rather than the edge side of the wafer W so that an etching process tends to be delayed at the center side, for example. In such cases, the $C_4F_8$ gas for accelerating the etching rate may be supplied to the first branch part 122, and the gas pipe 53 with the lengthened flow path may be connected to the first branch part 122. In another embodiment, predetermined amounts of the $C_4F_8$ gas may be supplied to the first branch part 122 and the second branch part 123, and the gas pipe 53 with the lengthened flow path may be connected to each of the first branch part 122 and the second branch part 123. In this way, when adjusting the etching rate at the center side and/or the edge side, the gas pipe 53 may be used to lengthen the gas flow path and prevent a gas concentration variation according to the molecular weight ratio of the Ar gas to the $C_4F_8$ gas.

Figure 10:
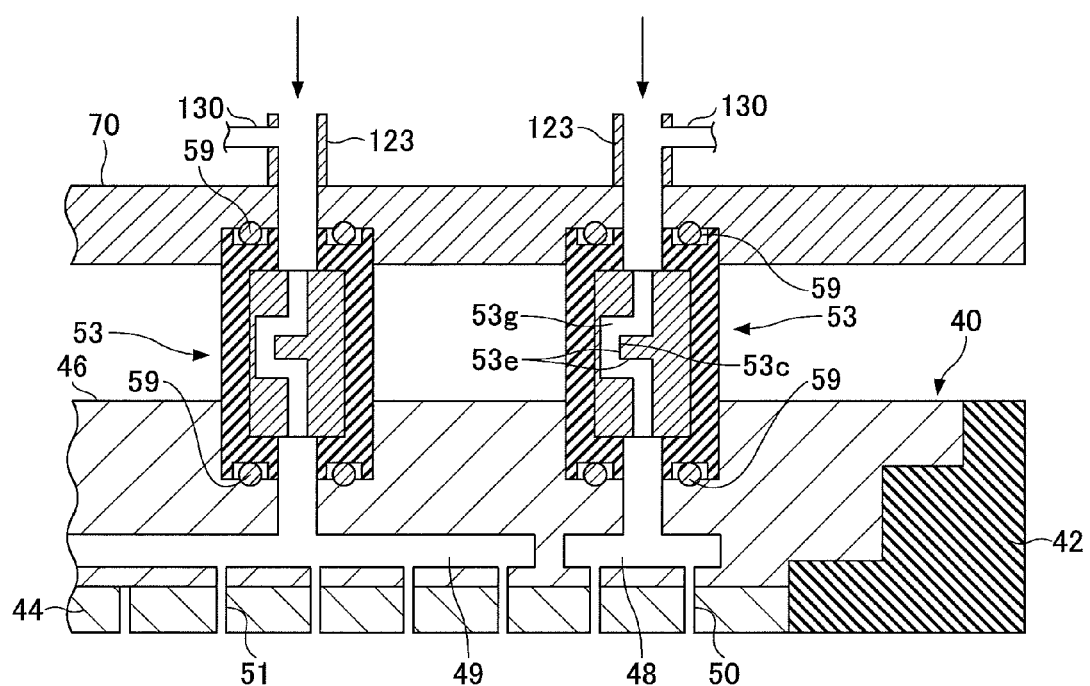
FIG. 10 is a cross-sectional view of a gas pipe according to a modified embodiment.

Also, although the bending portion 53d of the gas pipe 53 illustrated above is arranged into a spiral structure as an exemplary structure for lengthening the flow path without changing the conductance, the bending portion is not limited to such a spiral structure. For example, the bending portion 53e of the gas pipe 53 may alternatively include a U-shaped portion 53c to lengthen the gas flow path 53g in cross-sectional view as illustrated in FIG. 10, or the bending portion may include a V-shaped portion (not shown).

Also, although $C_4F_8$ gas with a molecular weight of 200 is introduced into the chamber 10 as the adjustment gas in the above-described embodiment, other fluorocarbon ($C_XF_Y$) gases such as $C_4F_6$ gas with a molecular weight of 162 or $C_5F_8$ gas with a molecular weight of 212 may be used as well. Also, although Ar gas, which is a rare gas with a molecular weight of 44, is used as the main gas of the processing gas in the above-described embodiment, some other type of gas such as He gas with a molecular weight of 4 may be used as the main gas. The molecular weight ratio of the adjustment gas to the main gas depends on the types of gases used. When $C_4F_6$ gas with a molecular weight of 162 is used as the adjustment gas and Ar gas with a molecular weight of 44 is used as the main gas, the adjustment gas-to-main gas molecular weight ratio may be at a minimum value of 3.68 (=162/44), and when $C_5F_8$ gas with a molecular weight of 212 is used as the adjustment gas and He gas with a molecular weight of 4 is used as the main gas, the adjustment gas-to-main gas molecular weight ratio may be at a maximum value of 53 (=212/4). That is, the molecular weight ratio of the adjustment gas to the main gas in embodiments of the present invention may be within a range of 3.68-53.

Although the plasma processing apparatus of the present invention is described above with reference to certain illustrative embodiments, the present invention not limited to these embodiments but includes numerous variations and modifications that may be made without departing from the scope of the present invention.

For example, the present invention may use various means for generating plasma including, but not limited to, capacitively coupled plasma (CCP) generation systems, inductively coupled plasma (ICP) generation systems, surface wave plasma generations systems including radial line slot antenna (RLSA) microwave plasma generation systems and slot plane antenna (SPA) plasma systems, for example.

Also, a processing object on which a plasma process is performed in the present invention is not limited to a semiconductor wafer but may instead be a large substrate for a flat panel display (FPD), a substrate for an electroluminescence (EL) device or a solar battery, or some other type of substrate, for example.

What is claimed is:

1. A plasma processing apparatus that turns a gas supplied to a processing chamber into plasma using a high frequency power and performs a plasma process on a processing object, the plasma apparatus comprising:
an upper electrode arranged at the processing chamber and including a plurality of gas supplying zones, the upper electrode being configured to supply a processing gas including a main gas to the processing chamber via the gas supplying zones;
a branch pipe including a plurality of branch parts, the branch pipe being configured to divide the processing gas according to a predetermined flow rate ratio and supply the divided processing gas to the plurality of gas supplying zones;
an addition pipe that is connected to at least one branch part of the plurality of branch parts, the addition pipe being configured to add an adjustment gas to the processing gas; and
a plurality of gas pipes that connect the plurality of branch parts of the branch pipe to the plurality of gas supplying zones,
wherein at least one gas pipe of the plurality of gas pipes that is connected to the branch part to which the addition pipe is connected includes a gas flow path that is arranged to have a bending portion for preventing a gas concentration variation according to a molecular weight ratio of the adjustment gas to the main gas,
wherein the gas flow path of at least one gas pipe of the plurality of gas pipes that is connected to the branch part to which the addition pipe is connected is arranged to have a distance such that a gas mixture of the adjustment gas and the main gas entering an inlet of the gas pipe reaches an outlet of the gas pipe upon or after an elapse of a reaction time required for the gas mixture of the adjustment gas and the processing gas to reach a uniform gas concentration, and
wherein the gas flow path of the gas pipe connected to the branch part to which the addition pipe is connected is configured based on the following formulas (A) and (B):

$$SL/Q=V/Q=t \quad (A)$$

$$Ln(C_{Ain}/C_{Aout})=-kt \quad (B)$$

wherein the symbols in the formulas represent the following:
S: gas pipe cross-sectional area [cm$^2$];
L: gas pipe length [mm];
Q: gas flow rate at gas pipe inlet/outlet, t: reaction time for the gas mixture of the main gas and the adjustment gas to reach the uniform gas concentration;
$C_{Ain}$: gas concentration [M] at gas pipe inlet;
$C_{Aout}$: gas concentration [M] at gas pipe outlet; and
k: diffusion coefficient.

2. The plasma processing apparatus as claimed in claim 1, wherein
the plurality of gas supplying zones are created by dividing up a region of the upper electrode radially into an outermost periphery zone and one or more inner periphery zones; and
the addition pipe is connected to at least one branch part of the branch pipe that communicates with the outermost periphery zone.

3. The plasma processing apparatus as claimed in claim 1, further comprising:
a ground member arranged outside the processing chamber and facing the upper electrode;
wherein the plurality of gas pipes are arranged between the upper electrode and the ground member.

4. The plasma processing apparatus as claimed in claim 1, wherein
the gas flow path of at least one gas pipe of the plurality of gas pipes that is connected to the branch part to which the addition pipe is connected is at least 150 mm.

5. A plasma processing apparatus that turns a gas supplied to a processing chamber into plasma using a high frequency power and performs a plasma process on a processing object, the plasma apparatus comprising:
an upper electrode arranged at the processing chamber and including a plurality of gas supplying zones, the upper electrode being configured to supply a processing gas including a main gas to the processing chamber via the gas supplying zones;
a branch pipe including a plurality of branch parts, the branch pipe being configured to divide the processing gas according to a predetermined flow rate ratio and supply the divided processing gas to the plurality of gas supplying zones;
an addition pipe that is connected to at least one branch part of the plurality of branch parts, the addition pipe being configured to add an adjustment gas to the processing gas; and
a plurality of gas pipes that connect the plurality of branch parts of the branch pipe to the plurality of gas supplying zones; and
a control unit that calculates a reaction time required for a gas mixture of the adjustment gas and the processing gas entering an inlet of a gas pipe of the plurality of gas pipes that has a distance of at least 150 mm to reach a uniform gas concentration at an outlet of the gas pipe, calculates a gas concentration ratio of the adjustment gas to the main gas based on the calculated reaction time, and controls a gas concentration of the adjustment gas and the main gas to be within the calculated gas concentration ratio,
wherein at least one gas pipe of the plurality of gas pipes that is connected to the branch part to which the addition pipe is connected includes a gas flow path that is arranged to have a bending portion for preventing a gas concentration variation according to a molecular weight ratio of the adjustment gas to the main gas, and
wherein the control unit controls the gas concentration of the adjustment gas and the main gas to be within the calculated gas concentration ratio calculated upon using the gas pipe having a distance of at least 150 mm based on the following formulas (A) and (B):

$$SL/Q = V/Q = t \tag{A}$$

$$\mathrm{Ln}(C_{Ain}/C_{Aout}) = -kt \tag{B}$$

wherein the symbols in the formulas represent the following:
S: gas pipe cross-sectional area [cm$^2$];
L: gas pipe length [mm];
Q: gas flow rate at gas pipe inlet/outlet;
t: reaction time for the gas mixture of the main gas and the adjustment gas to reach a uniform gas concentration;
$C_{Ain}$: gas concentration [M] at gas pipe inlet;
$C_{Aout}$: gas concentration [M] at gas pipe outlet; and
k: diffusion coefficient.

6. The plasma processing apparatus as claimed in claim 1, wherein the molecular weight ratio of the adjustment gas to the main gas is 3.68-53.

* * * * *